United States Patent
Blanchard, III et al.

(10) Patent No.: US 10,788,517 B2
(45) Date of Patent: Sep. 29, 2020

(54) CURRENT MEASURING APPARATUS AND METHODS

(71) Applicant: Analog Devices Global Unlimited Company, Hamilton (BM)

(72) Inventors: Paul Blanchard, III, Westford, MA (US); Jochen Schmitt, Biedenkopf (DE); Yogesh Jayaraman Sharma, Santa Clara, CA (US); Victor L. Iseli, Edmonds, WA (US)

(73) Assignee: ANALOG DEVICES GLOBAL UNLIMITED COMPANY, Hamilton (BM)

( * ) Notice: Subject to any disclaimer, the term of this patent is extended or adjusted under 35 U.S.C. 154(b) by 279 days.

(21) Appl. No.: 15/812,849

(22) Filed: Nov. 14, 2017

(65) Prior Publication Data
US 2019/0146009 A1 May 16, 2019

(51) Int. Cl.
*G01R 15/20* (2006.01)
(52) U.S. Cl.
CPC ......... *G01R 15/205* (2013.01); *G01R 15/202* (2013.01); *G01R 15/207* (2013.01)
(58) Field of Classification Search
CPC .. G01R 15/205; G01R 15/202; G01R 15/207; G01R 15/20
See application file for complete search history.

(56) References Cited

U.S. PATENT DOCUMENTS

| 5,422,566 A | 6/1995 | Boenning |
| 5,473,244 A | 12/1995 | Libove et al. |
| 5,717,326 A | 2/1998 | Moriwaki |
| 5,767,668 A | 6/1998 | Durand |
| 6,252,389 B1 | 6/2001 | Baba et al. |
| 6,411,078 B1 | 6/2002 | Nakagawa et al. |
| 6,731,105 B1 | 5/2004 | Hoyle et al. |

(Continued)

FOREIGN PATENT DOCUMENTS

| CN | 103487632 A | 1/2014 |
| DE | 102015100924 | 6/2016 |

(Continued)

OTHER PUBLICATIONS

International Search Report and Written Opinion issued in International Patent Application Serial No. PCT/EP2019/056734 dated May 31, 2019, 14 pages.

(Continued)

*Primary Examiner* — Douglas X Rodriguez
*Assistant Examiner* — Brent J Andrews
(74) *Attorney, Agent, or Firm* — Patent Capital Group

(57) ABSTRACT

Magnetic sensors may be positioned around an opening for a wire to measure the current flowing through the wire. A non-symmetric positioning of the sensors around the target measurement zone can enable an expanded measurement zone compared to conventional current measurement devices. Further, some sensors may be paired such that a hypothetical line connecting the sensors is tangential to the target measurement zone. Other sensors may be paired such that a hypothetical line between the sensors crosses the target measurement zone. The different pairs of the sensors can enable a reduction in the impact of stray field interference on the measurement of the current flowing through the wire.

20 Claims, 9 Drawing Sheets

(56) References Cited

U.S. PATENT DOCUMENTS

| | | | |
|---|---|---|---|
| 6,822,443 | B1 | 11/2004 | Dogaru |
| 7,164,263 | B2 | 1/2007 | Yakymyshyn et al. |
| 7,719,258 | B2 | 5/2010 | Chen et al. |
| 8,258,776 | B2 | 9/2012 | Koss et al. |
| 8,400,138 | B2 | 3/2013 | Cooper et al. |
| 8,818,749 | B2 | 8/2014 | Friedrich et al. |
| 8,922,194 | B2 | 12/2014 | Blake et al. |
| 9,063,184 | B2 | 6/2015 | Carpenter et al. |
| 9,151,807 | B2 | 10/2015 | Friedrich et al. |
| 9,689,903 | B2 | 6/2017 | Sharma et al. |
| 2003/0112006 | A1 | 6/2003 | Luetzow |
| 2005/0156587 | A1* | 7/2005 | Yakymyshyn ....... G01R 15/207 324/117 R |
| 2006/0261801 | A1 | 11/2006 | Busch |
| 2007/0063690 | A1 | 3/2007 | De Wilde et al. |
| 2008/0077336 | A1 | 3/2008 | Fernandes |
| 2009/0108841 | A1 | 4/2009 | Abe et al. |
| 2011/0248711 | A1 | 10/2011 | Ausserlechner |
| 2012/0187937 | A1 | 7/2012 | Blake et al. |
| 2012/0290240 | A1* | 11/2012 | Fukui ..................... G01R 15/20 702/65 |
| 2013/0033260 | A1 | 2/2013 | Nomura et al. |
| 2013/0076343 | A1* | 3/2013 | Carpenter .............. G01R 33/02 324/202 |
| 2013/0106400 | A1 | 5/2013 | Cheng et al. |
| 2013/0162245 | A1 | 6/2013 | Tamura |
| 2013/0285825 | A1 | 10/2013 | Peczalski |
| 2014/0028308 | A1 | 1/2014 | Ogomi et al. |
| 2014/0347036 | A1 | 11/2014 | Noh |
| 2015/0016006 | A1 | 1/2015 | Van Vroonhoven et al. |
| 2015/0042320 | A1 | 2/2015 | Cadugan et al. |
| 2015/0142376 | A1 | 5/2015 | Ausserlechner |
| 2015/0316623 | A1 | 11/2015 | Romero |
| 2015/0331072 | A1 | 11/2015 | Ogawa et al. |
| 2015/0338473 | A1 | 11/2015 | Diaconu |
| 2016/0047846 | A1* | 2/2016 | Sharma ................ G01R 15/207 324/251 |
| 2017/0184635 | A1* | 6/2017 | Ugge ................... G01R 15/207 |
| 2019/0293689 | A1* | 9/2019 | Lerner ................. G01R 15/202 |

FOREIGN PATENT DOCUMENTS

| | | |
|---|---|---|
| EP | 1 037 056 A1 | 9/2000 |
| EP | 2 202 527 A1 | 6/2010 |
| EP | 2776853 | 9/2014 |
| EP | 3248019 | 1/2016 |
| JP | H09-308615 A | 12/1997 |
| JP | 3681483 B2 | 8/2005 |
| JP | 2012-098205 A | 5/2012 |
| WO | WO 2011/154157 A1 | 12/2011 |
| WO | WO 2013/099504 A1 | 7/2013 |
| WO | 2015/144541 | 10/2015 |
| WO | 2016/116315 | 7/2016 |
| WO | 2019/096674 | 5/2019 |

OTHER PUBLICATIONS

International Search Report and Written Opinion issued in International Patent Application Serial No. PCT/2018/080684 dated Feb. 22, 2019, 20 pages.

Machine Translation of JP3681483B2 (5 above).

Rogowski Coil, Wikipedia Entry, http://en.wikipedia.org/wiki/Rogowski_coil (accessed Nov. 14, 2014), 5 pages.

Kaine-Krolak, "An Introduction to Infrared Technology: Applications in the Home, Classroom, Workplace, and Beyond . . .", 1995, trace.wisc.edu.

U.S. Appl. No. 16/003,701, filed Jun. 8, 2018, Contactless Current Measurement Using Magnetic Sensors.

Michael J. Haji-Sheikh, *Commercial Magnetic Sensors (Hall and Anisotropic Magnetoresistors)*, © Springer-Verlag Berlin Heidelberg 2008, 22 pages.

Helena G. Ramos et al., *Present and Future Impact of Magnetic Sensors in NDE*, Procedia Engineering 86 (2014), 1st International Conference on Structural Integrity, ICONS—2014, 14 pages.

Lisa Jogschies et al., *Recent Developments of Magnetoresistive Sensors for Industrial Applications*, Sensors 2015, 15, 28665-28689; doi:10.3390/s151128665, www.mdpi.com/journal/sensors, 25 pages.

Pavel Mlejnek et al., *AMR Yokeless Current Sensor with Improved Accuracy*, Procedia Engineering 168 (2016), 30th Eurosensors Conference, Eurosensors 2016, www.elsevier.com/locate/procedia, 4 pages.

Hao Yu et al., *Circular Array of Magnetic Sensors for Current Measurement: Analysis for Error Caused by Position of Conductor*, Sensors 2018, 18, 578; doi:10.3390/s18020578, www.mdpi.com/journal/sensors, 12 pages.

Honeywell, *1- and 2-Axis Magnetic Sensors HMC1001/1002/1021/1022*, Aug. 2008, www.honeywell.com/magneticsensors, 15 pages.

Honeywell, *3-Axis Magnetic Sensor*, HMC1023, Solid State Electronics Center, www.magneticsensors.com, Oct. 2013, 7 pages.

Honeywell, *1, 2 and 3 Axis Magnetic Sensors HMC1051/HMC1052/HMC1053*, Mar. 2006, www.honeywell.com/magneticsensors, 12 pages.

Office Action issued in U.S. Appl. No. 16/003,701 dated Dec. 26, 2019, 52 pages.

EN Translation (Google Translate) of EP3248019 (2 above).

Samplón-Chalmeta et al., *A Novel Calibration Method for Ampere's Law-Based Current Measuring Instruments*, IEEE Transactions on Instrumentation and Measurement, vol. 64, No. 3, Mar. 2015, 8 pages.

Notice of Allowance issued in U.S. Appl. No. 16/003,701 dated Jun. 2, 2020.

* cited by examiner

CURRENT MEASURING APPARATUS AND METHODS

FIELD OF THE DISCLOSURE

The described technology generally relates to measuring current and, more specifically, to apparatus and methods that involve measuring current flowing through a wire using magnetic sensors.

BACKGROUND

Accurate measurement of current through a wire remotely (e.g., without breaking the wire or coming into contact with it) is useful for diagnostic, operational, and protection purposes in many applications, such as industrial and automotive applications. In particular, accurate current measurement without precise control of the placement of the wire may present various challenges. It can also be challenging to accurately measure current through the wire remotely when there are other current carrying wires located nearby as the current flowing though such wires can interfere with the desired current measurement. One commonly used technique for alternating current (AC) measurements is using a Rogowski coil, which does not depend on the precise location of the wire inside the coil. However, Rogowski coils cannot make direct current (DC) measurements and can be too bulky for use in tight spaces.

SUMMARY OF THE DISCLOSURE

The systems, methods and devices of this disclosure each have several innovative aspects, no single one of which is solely responsible for the all of the desirable attributes disclosed herein. Details of one or more implementations of the subject matter described in this specification are set forth in the accompanying drawings and the description below.

Sensors may be positioned around an opening for a wire to measure the current flowing through the wire. A nonsymmetric positioning of the sensors around the target measurement zone can enable an expanded measurement zone compared to conventional current measurement devices. Further, some sensors may be paired such that a hypothetical line connecting the sensors is tangential to the target measurement zone. Other sensors may be paired such that a hypothetical line connecting the sensors crosses the target measurement zone. The different pairing of the sensors enables a reduction in the impact of stray field interference on the measurement of the current flowing through the target wire under measure. The sensors may have multiple distances from the center of the measurement region creating a design with multiple radius lengths. The multiple radii enable an increase in accuracy in the target region and allow a wider dynamic range of currents to be measured.

Certain embodiments of the present disclosure relate to an apparatus for measuring current flow through a wire. The apparatus may include a housing with an opening configured to receive a wire. The opening may correspond to a target measurement zone for measuring a current flowing through the wire when the wire is positioned within the opening. The apparatus may further include a first pair of magnetic sensors within the housing that may be positioned such that a line between the magnetic sensors of the first pair is substantially tangential to the target measurement zone. Further, the apparatus may include a second pair of magnetic sensors within the housing that may be positioned such that a line between the magnetic sensors of the second pair crosses through the target measurement zone. Moreover, the apparatus may include a hardware processor in communication with the first pair of magnetic sensors and the second pair of magnetic sensors. The hardware processor may be configured to derive a measure of the current flowing through the wire based on outputs from the first pair of magnetic sensors and the second pair of magnetic sensors.

Additional embodiments of the present disclosure relate to a method of measuring current through a wire. The method may include calculating a first differential signal value based at least in part on output signals from a first pair of magnetic sensors and calculating a second differential signal value based at least in part on output signals from a second pair of magnetic sensors. Further, the method may include deriving a measure of current flowing through a wire positioned within a target measurement zone based at least in part on the first differential signal and the second differential signal, so as to reduce an impact of one or more stray fields on the measure of current relative to using one of the first differential signal or the second differential signal.

Some embodiments of the present disclosure relate to an apparatus for measuring current flow through a wire. The apparatus may include a housing with an opening configured to receive a wire. The opening may correspond to a target measurement zone for measuring a current flowing through the wire when the wire is positioned within the opening. The apparatus may further include a first set of sensors positioned a first distance from a center point of the target measurement zone and a second set of sensors positioned a second distance from the center point of the target measurement zone. Further, the apparatus may include a hardware processor in communication with the first set of sensors and the second set of sensors. The hardware processor may be configured to derive a measure of the current flowing through the wire based on outputs from the first set of sensors and the second set of sensors.

BRIEF DESCRIPTION OF THE DRAWINGS

Throughout the drawings, reference numbers are re-used to indicate correspondence between referenced elements. The drawings are provided to illustrate embodiments of the subject matter described herein and not to limit the scope thereof.

DETAILED DESCRIPTION

Figures 1A, 1B:
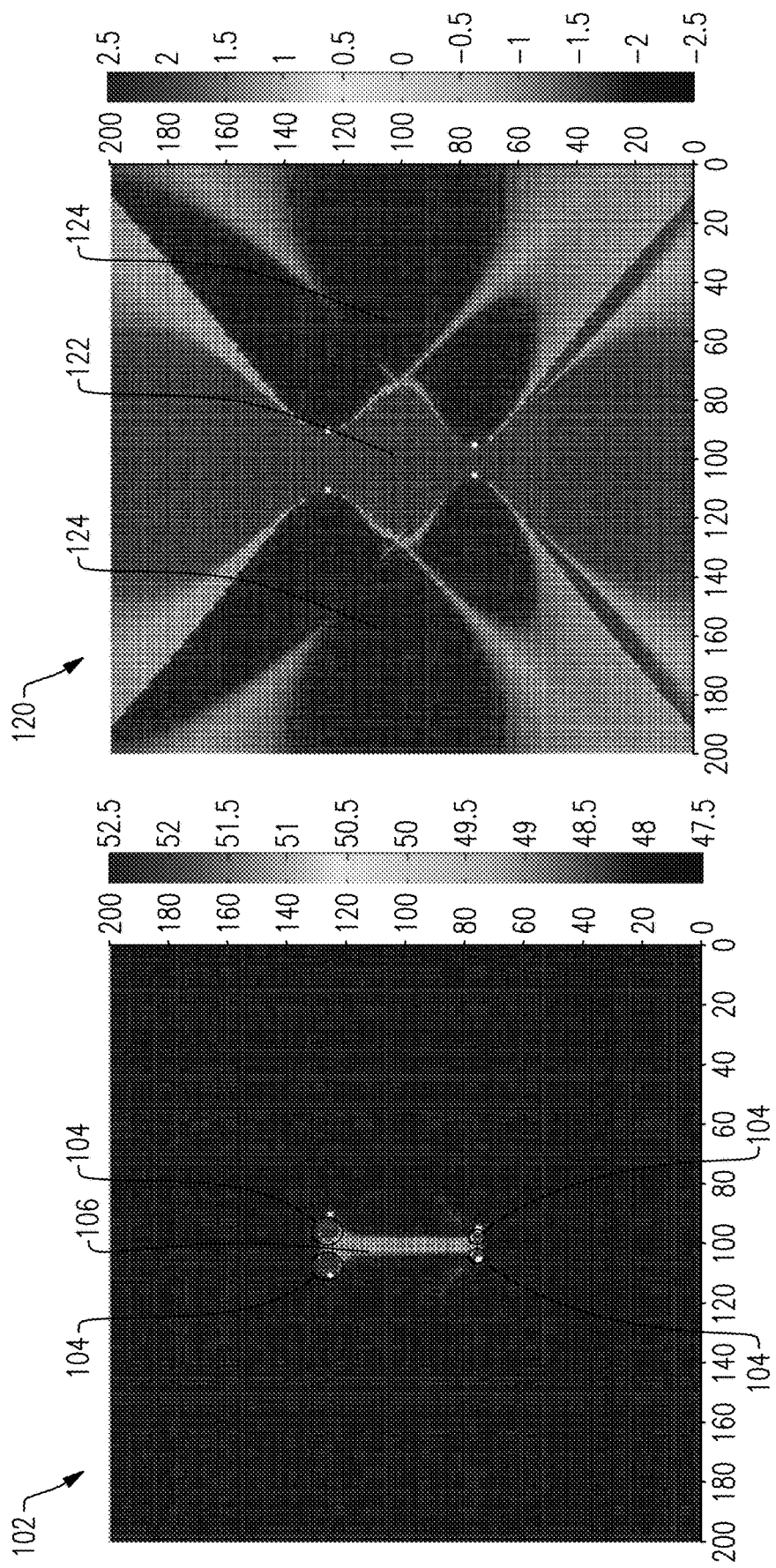
FIG. 1A graphically illustrates a measurement zone for measuring the current in a wire for some current measurement systems.
FIG. 1B graphically illustrates the region of accuracy in the measurement zone of FIG. 1A for some current measurement systems.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

A current carrying wire generates a magnetic field in the orthogonal plane to the direction of current flow. A measurement of the magnetic field can be used to infer the magnitude of the current flowing in the wire. Hall Effect sensors can be used to measure magnetic fields using the Lorentz effect. Anisotropic magnetoresistive (AMR) sensors can measure the magnetic field based on the change in resistivity that is proportional to the perpendicular magnetic field. By using magnetic sensors, such as Hall Effect sensors and/or AMR sensors, certain challenges related to measuring current through a wire can be overcome according to aspects of this disclosure. For instance, embodiments described herein can overcome challenges related to the magnetic field interference from nearby current carrying wires. As another example, embodiments described herein can overcome challenges related to a location of the current carrying wire not being fixed. Since magnetic field strength should drop off inversely with distance from the current carrying wire, the distance from the wire can have a significant impact on inferring the current flowing through the wire using magnetic sensors. Furthermore, using certain magnetic sensors, such as Hall Effect and/or AMR sensors, apparatus disclosed herein can generate outputs that can be used to accurately make both alternating current (AC) and direct current (DC) measurements.

To obtain an accurate reading of the current in a wire, certain applications rely on the wire being positioned at a certain point between the sensors of a current measuring device. Some current measuring systems can only measure the current from a wire at a particular point between the sensors of the current measuring device. If the wire is not located within the region, the measurement of the current may be inaccurate or not possible. FIG. 1A graphically illustrates a measurement zone for measuring the current in a wire for some current measurement systems. The regions 104 of the graph 102 represent the location of sensors within the current measuring device. The lighter region 106 in the graph 102 represents a region of relatively accurate measurement of the current in a wire. The scale is in millimeters with each division on the scale representing 2.5 mm. Thus, the measurement zone in FIG. 1A is approximately 1 cm in the horizontal direction by about 4 cm in the vertical direction. As can be seen from the graph 102, movement of the wire within the x-coordinate space results in a decrease in the accuracy of the current measurement by the current measurement device. Thus, the wire must be positioned at the center of the x-coordinate space of a target measurement zone to obtain an accurate current measurement. However, it may not be possible or practicable to center the wire because, for example, of the position of the wire with respect to other components of a device or the location of the wire with respect to an installation site for a device that includes the wire.

Not only can it be challenging to position a current measurement device with respect to a wire to obtain an accurate measurement of the current flowing through a wire, but it can be difficult to differentiate the signal in the wire from stray fields. These stray fields may be caused by neighboring wires or interference from other signals relatively near the wire being measured. FIG. 1B graphically illustrates the region of accuracy in the target region. Stray field interference can impact the accuracy of measurements outside of the target region. The region 122 in the center of graph 120 illustrates a measurement zone of the wire with a high accuracy. The regions 124 to either side of the region 122 represent levels of significant performance degradation due to stray field interference. As can be seen from the graph 120, movement of the wire within the x-coordinate space results in a degradation of performance of the current measurement device due to, for example, stray field interference.

Some current measuring devices attempt to address the problem of positioning the wire with respect to the sensors of the current measuring device to obtain maximum accuracy while reducing stray field interference by deterministically locating the wire. The wire may be deterministically located by shaping an opening of the current measuring device. For example, some current measuring devices shape the opening of the current measuring device to force the wire to remain at an optimal measurement point. For instance, the opening may be formed by two prongs that create a 'V' shape forcing the wire into the bottom of the 'V' shaped opening. However, this solution may not be optimal in some cases in which the position of the wire with respect to other physical components prevents the wire from being directed into the desired portion of the 'V' shaped opening for optimal measurement. For example, if two wires are positioned close together, it may not be possible to align a wire with respect to the opening of the current measuring device without causing damage to the other wire. And if because of its proximity the second wire enters the measurement zone, it can generate stray field interference that interferes with the measurement of the desired wire.

Embodiments disclosed herein present a current measuring device that enlarges the measurement zone while reducing stray field interference. Thus, current of a wire can be measured without precise positioning of the wire and without impact or with reduced impact from stray field interference. Advantageously, in certain embodiments, by expanding the measurement zone of the current measuring device, wires that cannot be deterministically located within a particular point or axis can be accurately measured during a current measurement process. Embodiments disclosed herein include a plurality of sensors positioned around a target measurement zone. The sensors may be magnetic sensors, such as anisotropic magnetoresistance (AMR) sensors or Hall effect sensors. The plurality of sensors can include eight sensors. However, the present disclosure is not limited as such, and more or fewer sensors may be included. For example, some embodiments may include 4 sensors or 12 sensors. These sensors may be positioned around the target measurement zone at a plurality of distances from a center of the target measurement zone. Further, at least some of the sensors may be positioned such that a straight line between the sensors is tangential or substantially tangential to the target measurement zone, and at least some of the sensors may be positioned such that a straight line between the sensors crosses through the target measurement zone.

Example Current Measurement System

Figure 2:
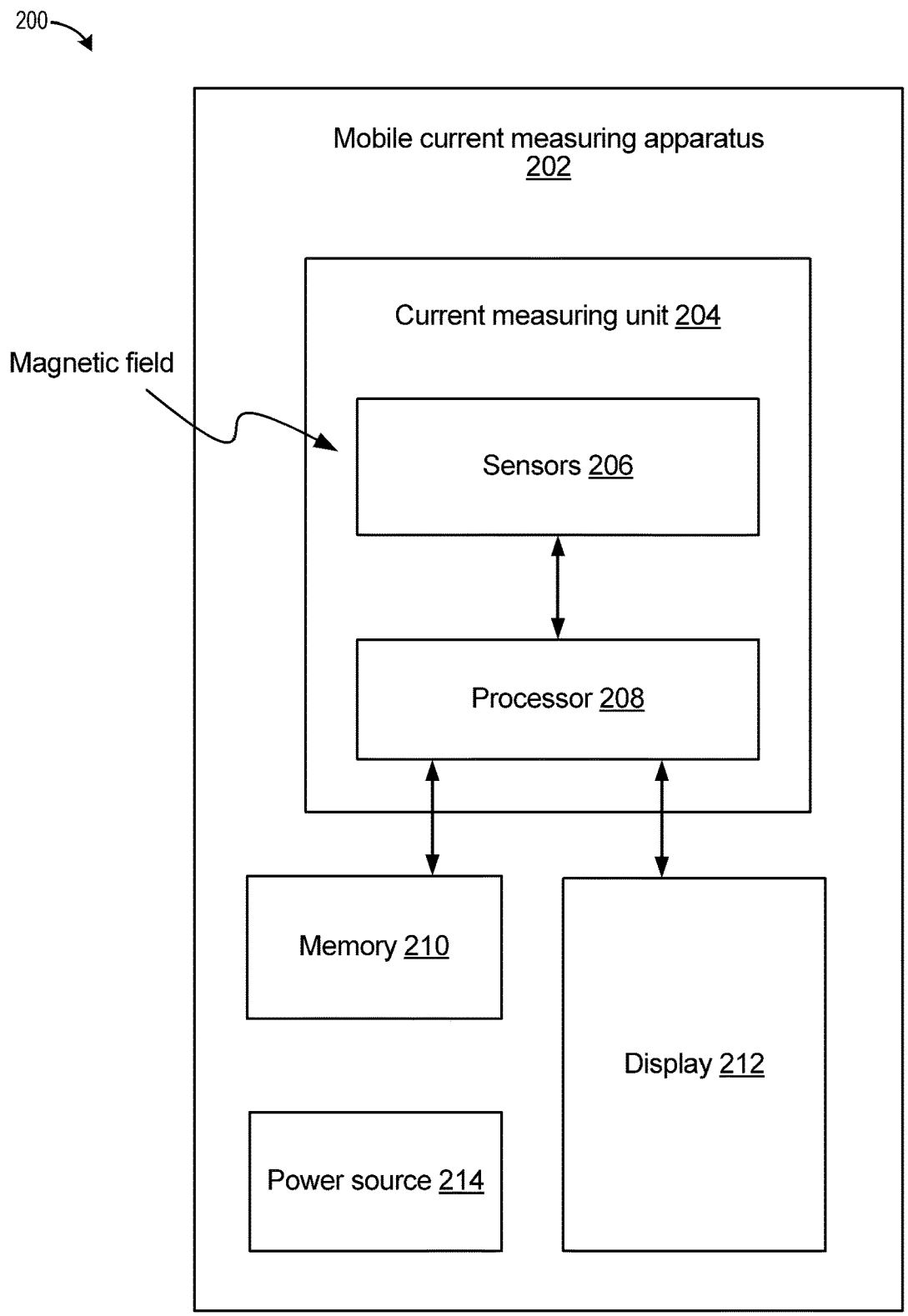
FIG. 2 is a block diagram illustrating an example current measurement system in accordance with certain embodiments.

FIG. 2 is a block diagram illustrating an example current measurement system 200 in accordance with certain embodiments. The illustrated system includes a mobile current measuring apparatus 202, having a current measuring unit 204, memory 210, a display 212, and a power source 214. The current measuring unit 204 may include sensors 206 and a processor 208. This processor 208 may be configured to implement one or more software programs. The sensors 206 are configured to sense, for example, the differential magnetic field generated by current flowing through a wire. The sensors 206 may include a number of sensors positioned around a target measurement zone for measuring the current in a wire. For example, the sensors 206 may include 4, 8, or 12 sensors, among other numbers of sensors. In some embodiments, some or all of the memory 210, the display 212, and the power source 214 may reside in the same integrated unit as the sensors 206 and the processor 208. Certain example non-limiting embodiments of the current measurement system 200 may be found in U.S. Pat. No. 9,689,903, which issued on Jun. 27, 2017 and is titled "APPARATUS AND METHODS FOR MEASURING CURRENT," the disclosure of which is hereby incorporated by reference in its entirety herein.

The memory 210 may be a non-transitory machine-readable storage medium such as a RAM, ROM, EEPROM, etc. The memory 210 may be in communication with the processor 208, which may read from or write to the memory 210. The display 212 may be configured to show the result of the current measurement performed in accordance with the disclosures herein. The display 212 may be any type of screen display, such as plasma display, liquid crystal display (LCD), organic light emitting diode (OLED) display, electroluminescent (EL) display, or any other indicator, such as a dial, barometer, or LEDs. Further, in some embodiments, the display 212 may be a touchscreen display. In some implementations, the system may include a driver (not shown) for the display 212. The power source 214 may provide power to substantially all components of the system of FIG. 2. In some implementations, the power source 214 may be one or more battery units.

Example Current Measuring Apparatus

Figure 3:
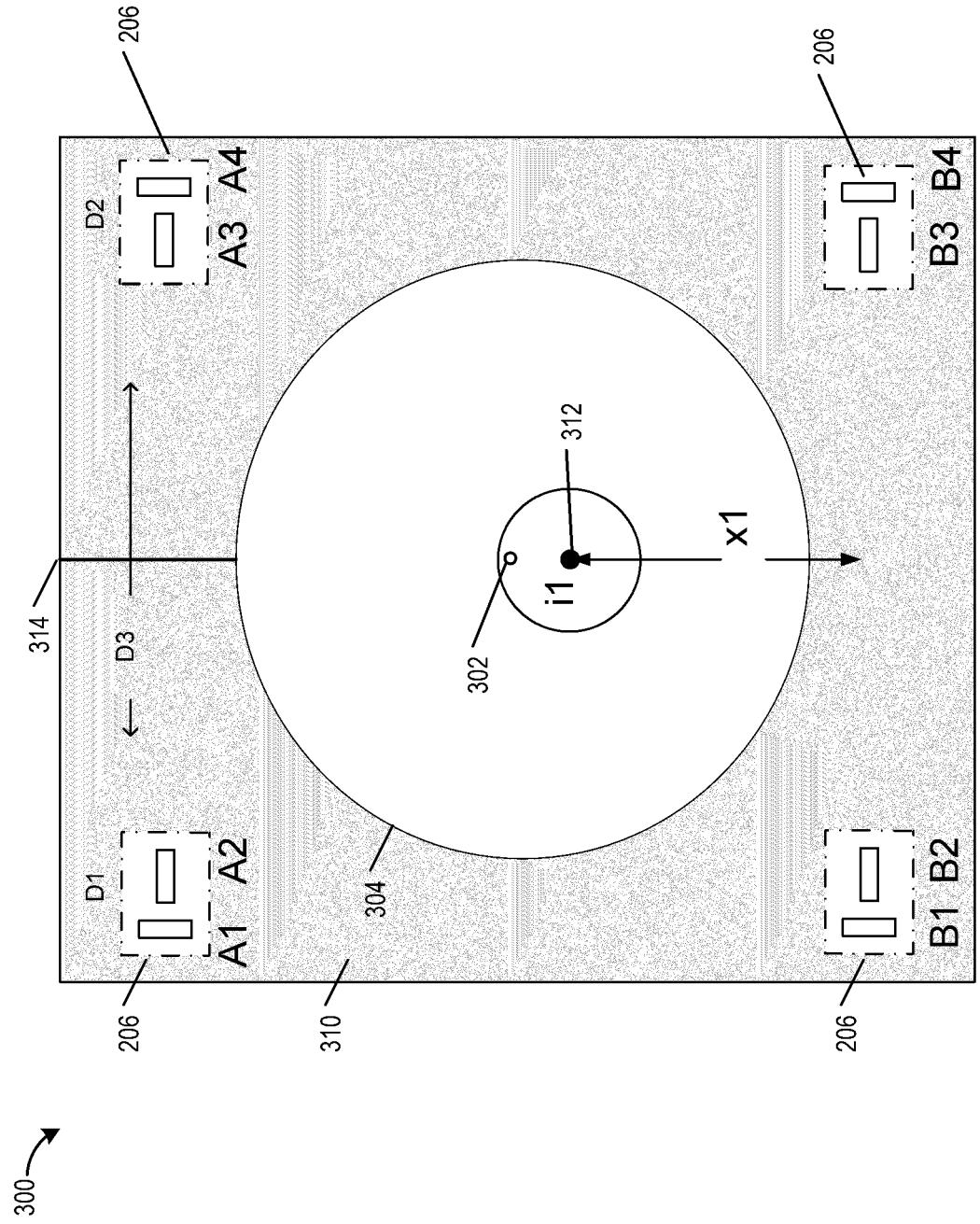
FIG. 3 is a block diagram illustrating an example apparatus for measuring current in accordance with certain embodiments.

FIG. 3 is a block diagram illustrating an example apparatus 300 for measuring current in accordance with certain embodiments. The current measuring apparatus 300 may be included as part of the current measurement system 200. For example, the apparatus 300 may comprise the current measuring unit 204 of the current measurement system 200. The apparatus 300 may include a plurality of sensors 206, a target measurement zone 304 with a center 302, and a structure 310 housing the sensors 206 and forming the target measurement zone 304. Further, a wire 312 to be measured may be located within the target measurement zone. In some cases, the structure may include an ingress point represented by the line 314 for inserting the wire 312 into the target measurement zone 304.

The apparatus 300 may include a plurality of sensors 206 (labelled individually as A1, A2, A3, A4, B1, B2, B3, and B4). The sensors 206 can be AMR sensors. The sensors 206 may be located within a physical structure 310 that at least partially surrounds a target measurement zone 304 in at least one plane. The structure 310 can be a housing. The housing can enclose the sensors 206. Although the structure 310 is illustrated as completely surrounding the target measurement zone 304, the present disclosure is not limited as such. For example, the structure 310 may form a fork, or a 'V' or 'U' shape. Thus, although the target measurement zone 304 is illustrated as circular or substantially circular, it may instead be another shape, such as an oval or rectangle. Further, the structure 310 may be capable of opening and closing to enable a wire to slot into or be moved into the target measurement zone 304 from an opening. For example, the line 314 may represent the meeting of two separate arms, such as with a clamp, of the structure 310 that can be adjusted to form an opening. The opening and/or target measurement zone 304 may be orthogonal to a length of the wire being tested when the wire is positioned within the opening or target measurement zone 304.

Although eight sensors are illustrated, it should be understood that the apparatus 300 may include a different number of sensors. For example, the apparatus 300 may include 4, 6, 10, or 12 sensors, among other amounts. As illustrated in FIG. 3, some of the sensors may be oriented differently than at least some other of the sensors. For example, sensors A1 and A2 are adjacent to each other and oriented substantially orthogonal to each other. The apparatus 300 is an illustrative example and is may not necessarily be drawn to scale. Thus, although each of the sensors are illustrated as being roughly equidistant from the center 302 of the target measurement zone 304, in certain embodiments, at least some of the sensors may be located a different distance from the target measurement zone 304 than at least some of the other sensors. The position of the sensors 206 may be selected to measure the current flowing through a wire positioned within the target measurement zone 304 with a threshold degree of accuracy, such as 98% or 99% accuracy, or better. In some cases, the threshold degree of accuracy may be within a sub-zone of the target measurement zone. For example, the threshold degree of accuracy may be set at 99% over a 1 centimeter radius centered within the target measurement zone 304. The 1 centimeter radius may define the entire target measurement zone, or an inner circle of the target measurement zone 304.

The target measurement zone 304 may represent a region intended for or identified as a region where a wire to be measured should be located to obtain a measurement of the current of the wire. Although the target measurement zone 304 is illustrated as being within the entire opening or inner region created by the structure 310, in some embodiments the target measurement zone 304 may be smaller than the inner region created by the structure 310. In some embodiments, the target measurement zone 304 may include a region with an above threshold level of accuracy for measuring the current of a wire 312. In contrast to some conventional current measurement devices, the wire to be measured need not be positioned in a precise X and/or Y coordinate location to accurately measure current flowing through the wire, but may be located anywhere within the target measurement zone 304. This target measurement zone 304 may vary in size based on a location of the sensors 206 with respect to the structure 310 and the target measurement zone 304. Further, in some embodiments, a trade-off may occur between the size of the target measurement zone and/or the amount of stray field interference on the measurement of the current flowing through a wire positioned within the target measurement zone. The target measurement zone 304 may be substantially circular in shape and may have a radius of 1-2 cm. In some other embodiments, the target measurement zone 304 may have a smaller or larger radius or may be of a different shape. For example, the target measurement zone 304 may be oval in shape. In some such cases, the structure 310 may create an oval region or region of some other shape that is capable of accepting a wire or at least partially surrounding a wire to be measured.

Example Sensor Placement

Figure 4:
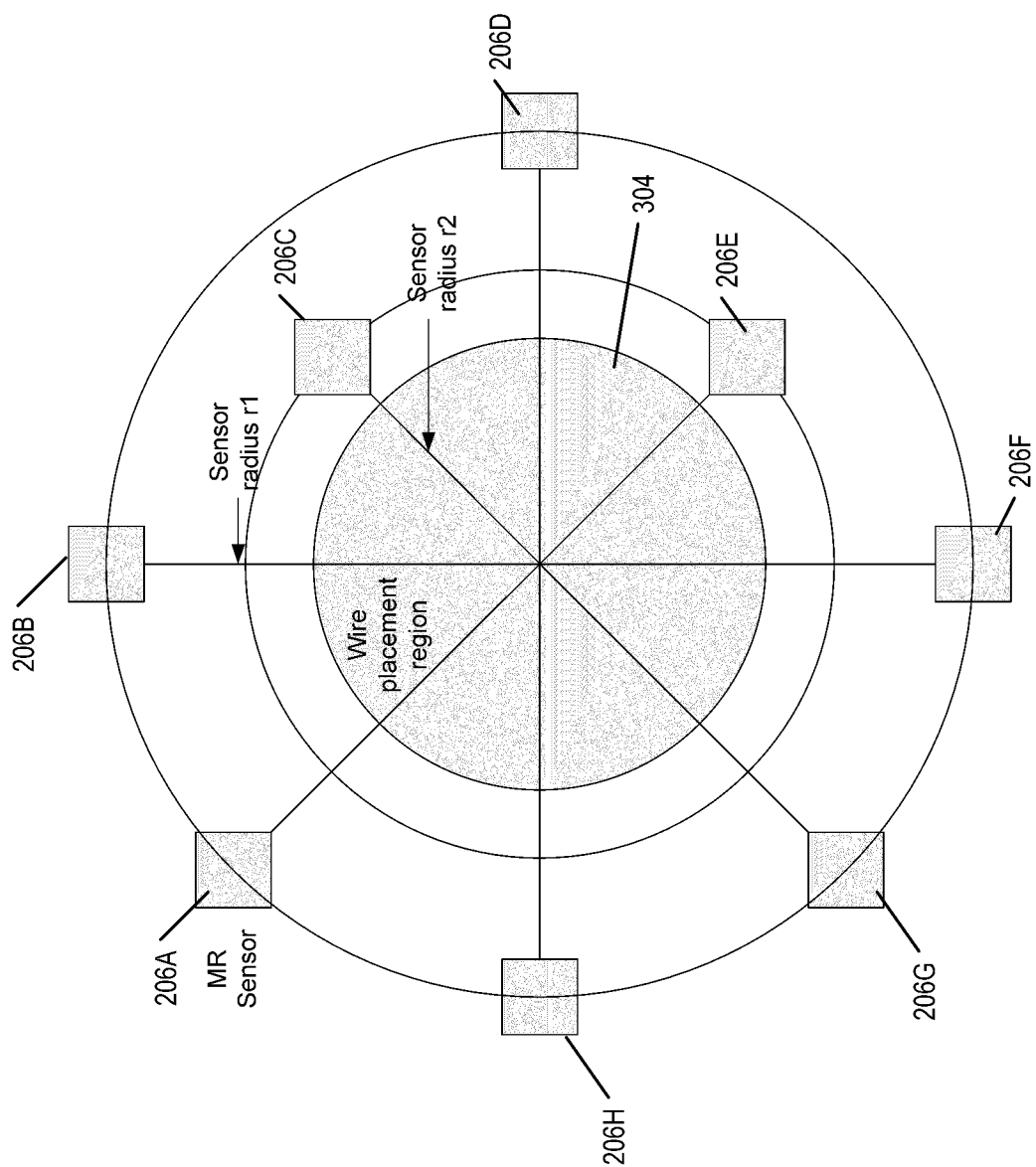
FIG. 4 illustrates a placement of sensors within an example apparatus for measuring current in accordance with certain embodiments.

FIG. 4 illustrates a placement of sensors 206 within an example apparatus for measuring current in accordance with certain embodiments. The sensors 206 may include individual sensors 206A, 206B, 206C, 206D, 206E, 206F, 206G, and 206H. As illustrated, the sensors 206 may be positioned around a wire placement region or target measurement zone 304. The sensors 206 may be placed at different distances from the target measurement zone 304. For example, the sensors 206C and 206E may be positioned a first distance (e.g., sensor radius r1) from a center point of the target measurement zone 304. The remaining sensors illustrated in FIG. 4 may be positioned a second distance (e.g., sensor radius r2) from the center point of the target measurement zone 304. Although sensors 206 are illustrated as being positioned at two different distances, this disclosure is not limited as such. In some embodiments, at least some of the sensors may be positioned at three, four, or more different distances from the center of the target measurement zone 304. Advantageously, in certain embodiments, by positioning sensors 206 at different distances from the target measurement zone 304, the accuracy of the current measurement within the target measurement zone 304 is increased and the stray field attenuation is reduced. The determination of where to place the sensors, including what distances to place each sensor from the center of the target measurement zone, may depend on a number of factors. These factors may include, for example, the number of sensors, the desired shape and/or size of the target measurement zone, the amount of stray field rejection desired, or any suitable combination thereof. In some embodiments, the measurement of current within the wire may have an accuracy of approximately 99% within a target measurement zone with a 1 cm radius. Further, certain embodiments disclosed herein may achieve at least −40 dB stray field attenuation at a distance of 3 cm from a center of the target measurement zone.

Figure 5:
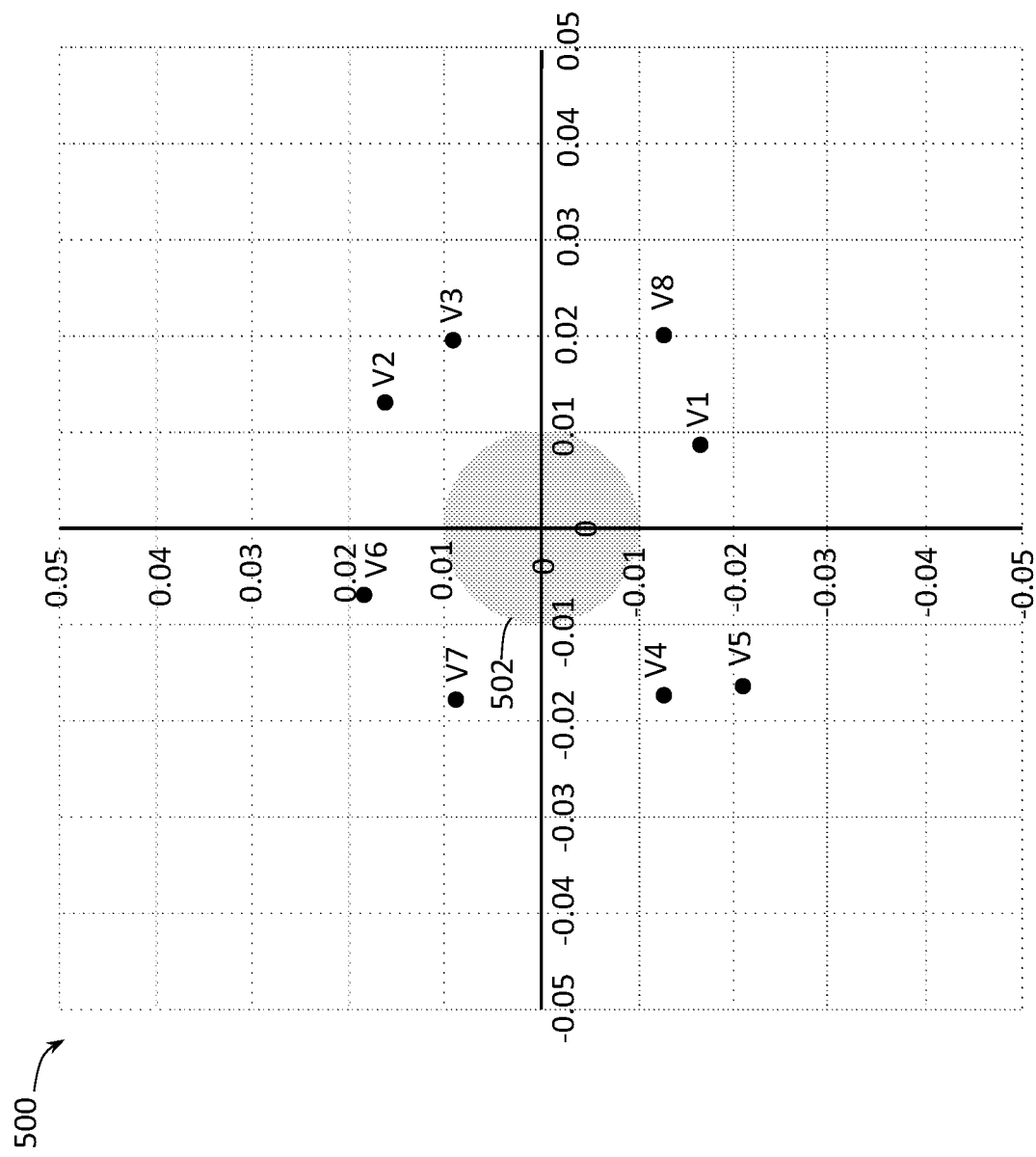
FIG. 5 graphically illustrates a placement of sensors for measuring current in accordance with certain embodiments.

FIG. 5 illustrates a placement of sensors for measuring current in accordance with certain embodiments. The graph 500 represents the placement of sensors within the structure 310, or within a current measurement device, relative to a target measurement zone 502, which is represented by the circle in the graph 500. As illustrated by the graph 500, sensors of the current measurement device may be positioned at more than two different distances from the target measurement zone. The sensors, represented by the points V1-V8 in the graph 500, maybe positioned around the target measurement zone. In certain embodiments, the sensors are positioned to form a number of crosses, for example, as illustrated with respect to FIGS. 6A-6C.

Figure 6C:
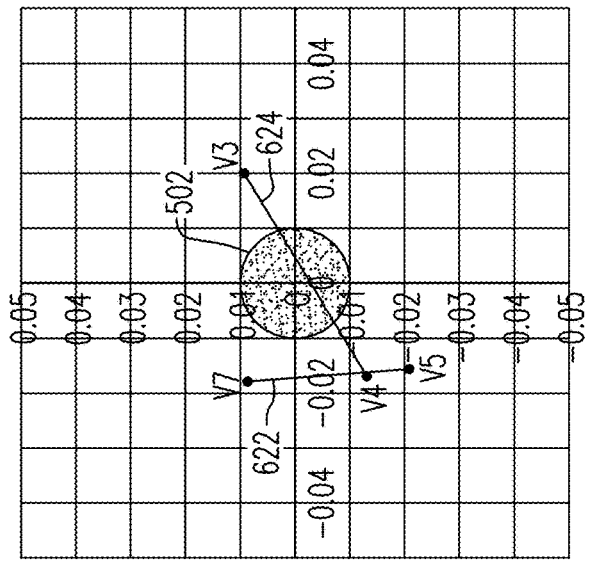
FIG. 6C graphically illustrates a third pairing of pairs of sensors of FIG. 5 for measuring current in accordance with certain embodiments.
Figure 6B:
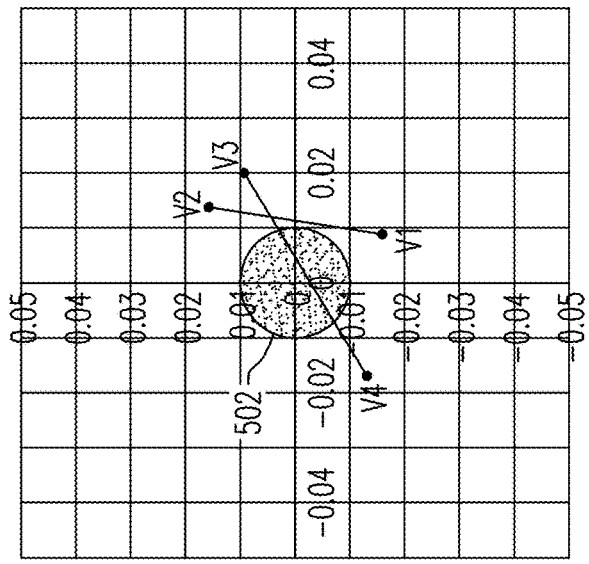
FIG. 6B graphically illustrates a second pairing of pairs sensors of FIG. 5 for measuring current in accordance with certain embodiments.
Figure 6A:
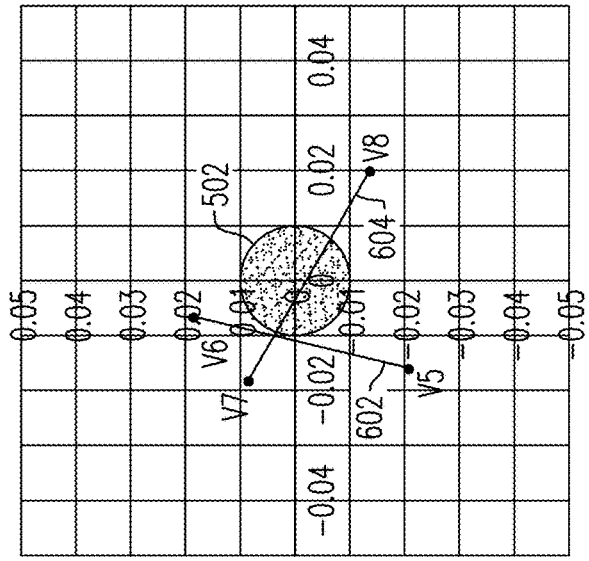
FIG. 6A graphically illustrates a first pairing of pairs of sensors of FIG. 5 for measuring current in accordance with certain embodiments.

FIGS. 6A, 6B, and 6C illustrate the pairing of sensors of FIG. 5 for measuring current in accordance with certain embodiments. In these figures, only a subset of the sensors of FIG. 5 are shown. As illustrated, for example with respect to FIG. 6A, two pairs of sensors are positioned to form a cross or 'X' shape based on a hypothetical or imaginary line between each of the pair sensors. This line is typically a direct or straight line between the sensors. In certain embodiments, the sensors are positioned such that one arm of the cross is tangential to the target measurement zone 502, and one arm of the cross crosses through the target measurement zone 502. For example, line 602 in FIG. 6A extends from sensor V5 to sensor V6 and line 604 extends from sensor V7 to sensor V8. The line 602 is tangential to the target measurement zone 502 and crosses line 604, which crosses the target measurement zone 502. Although the line crossing through the target measurement zone 502 may bisect or cross through the center of the target measurement zone 502, as illustrated by the line 604, the line crossing through the target measurement zone 502 does not necessarily bisect the target measurement zone 502, but may instead divide the target measurement zone 502 into two unequal portions.

Each set of four sensors may be positioned in a cross like pattern similar to the sensors of FIG. 6A. Thus, FIG. 6B illustrates another set of four sensors that are arranged in the cross pattern. Further, although the cross created by the four sensors may in some cases form 90° angles between the lines, the angles created by the cross may form angles of less than or greater than 90° as illustrated with respect to FIG. 6B.

In certain embodiments, at least some of the sensors used to form the cross pattern may be duplicative. In other words, in some cases, one or more sensors may be used to form multiple cross patterns with different sensors of the set of sensors 206. For example, the sensors V3 and V4 can be used to form two different crosses. One cross is illustrated in FIG. 6B where an imaginary line connecting sensors V3 and V4 crosses and imaginary line connecting sensors V1 and V2. FIG. 6C illustrates another cross where the imaginary line between the sensors V3 and V4 crosses an imaginary line connecting the sensors V5 and V7. Further, the line that is tangential to the target measurement zone 502 may, in some cases, not be perfectly tangential to the target measurement zone 502. For example, the line 622 connecting the sensors V5 and V7 is located a distance away from the target measurement zone 502. Even when the line 622 is not tangential to the target measurement zone, but is instead parallel to a hypothetical line that is tangential to the target measurement zone, the line 622 still may cross the line 624 that passes through the target measurement zone.

Advantageously, in certain embodiments, by positioning sets of four sensors in cross patterns with one pair of sensors crossing through the target measurement zone in one pair sensors being tangential to the target measurement zone, it is possible to both expand the target measurement zone and to increase the accuracy of current measurements for measuring the current of wires placed within the target measurement zone. Further, the positioning of the sensors reduces the impact of interference from stray fields, such as those that may be generated by nearby wires, on the measurement of the current of the wire to be measured. In certain embodiments, sensor positions may be considered optimal when the sensor positions are evaluated, and, based upon the evaluation, the positions provide optimal accuracy in the target region, and optimal stray field rejection. The evaluation process may consider a potential set of sensor positions, and calculate the performance of the sensor positions over a set of currents placed at a set of stray field positions and target current positions. In certain embodiments, the positioning of the sensors is based on twelve different relationships between the eight sensors. Thus, as illustrated in FIGS. 6A-6C, three different crosses using four sensors are formed from the eight sensors illustrated in FIG. 5.

Figures 7A, 7B:
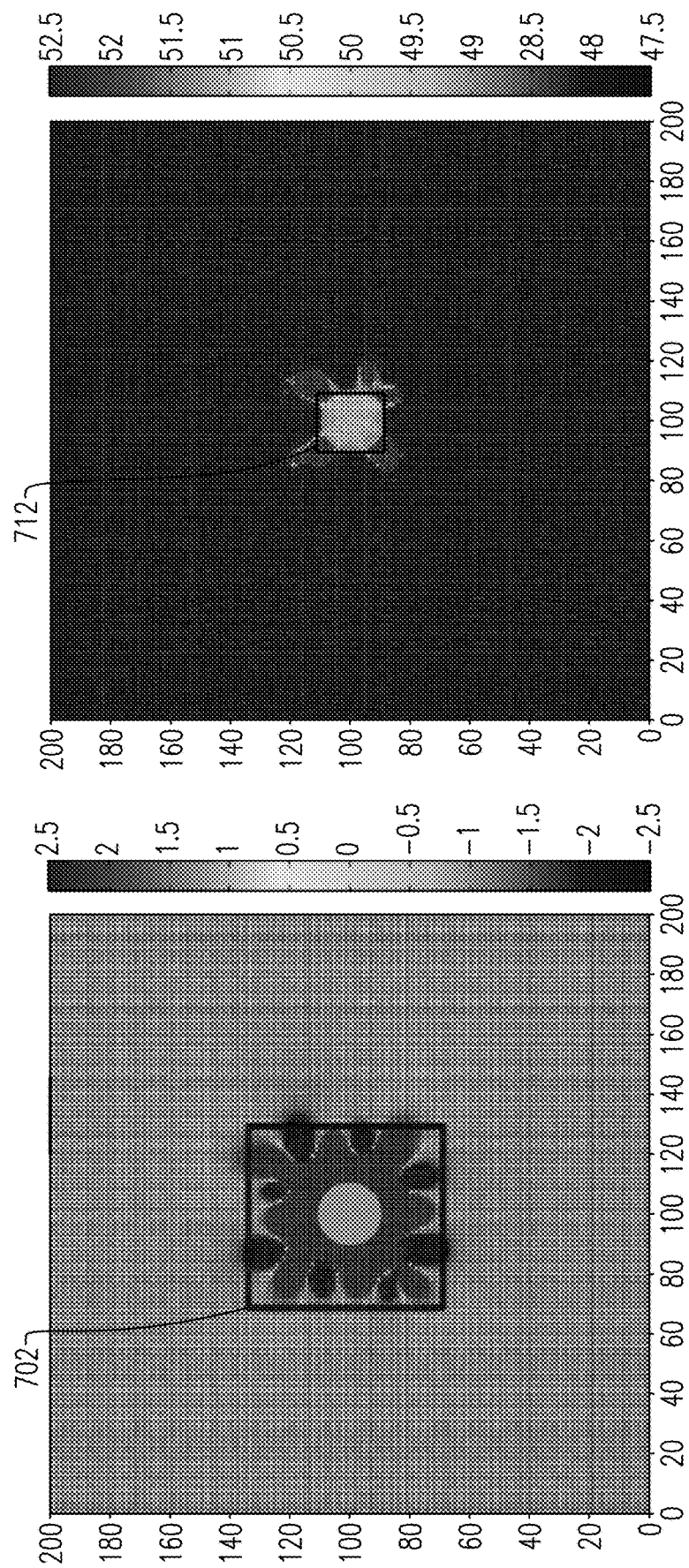
FIG. 7A illustrates graphically a measurement zone for measuring the current in a wire in accordance with certain embodiments.
FIG. 7B illustrates graphically the impact of interference caused by stray fields around the measurement zone of FIG. 7A in accordance with certain embodiments.

FIG. 7A graphically illustrates a measurement zone for measuring the current in a wire in accordance with certain embodiments based on the position of the sensors as illustrated in FIG. 5. As illustrated by the box 702 surrounding the measurement zone created by the sensors, the measurement zone in certain embodiments can be about 6 cm². In contrast, as illustrated in FIG. 1A, certain existing current measurement systems have a measurement zone of approximately 1 cm in the horizontal direction and 4 cm in the vertical direction. Simulations have demonstrated a current measurement accuracy of at least 99% within a 1 cm radius of the center of the target measurement zone.

FIG. 7B graphically illustrates the impact of interference caused by stray fields around the measurement zone of FIG. 7A in accordance with certain embodiments. The lighter region surrounded by the box 712 represents an area of interference by other wires positioned within the region. In other words, if two wires were positioned within the target measurement zone represented by the box 712, each wire would interfere with the reading of the other wire. However, the region external to the box 712 indicates little to no interference, even by a wire placed directly next to the measurement zone. In contrast, as illustrated in FIG. 1B by the regions 124, a wire or other interference causing system, device, or signal positioned next to the measurement region 122 may interfere with the measurement of the current of a wire positioned within the measurement region 122 of some existing current measurement systems. Advantageously, in certain embodiments, a wire that is difficult to separate from other components or that is near other components, such as other current carrying wires, can be more accurately measured compared to other systems that suffer from stray field interference. Simulations have demonstrated that the impact of stray field interference on current measurement of the wire is −40 dB at up to 3 cm from the center of the target measurement zone. Further, embodiments herein, at a distance of 10 cm away from the center of the target measurement zone, can offer up to a 100× improvement in the current measurement accuracy than some existing current measurement systems.

Example Sensor Placement Process

Figure 8:
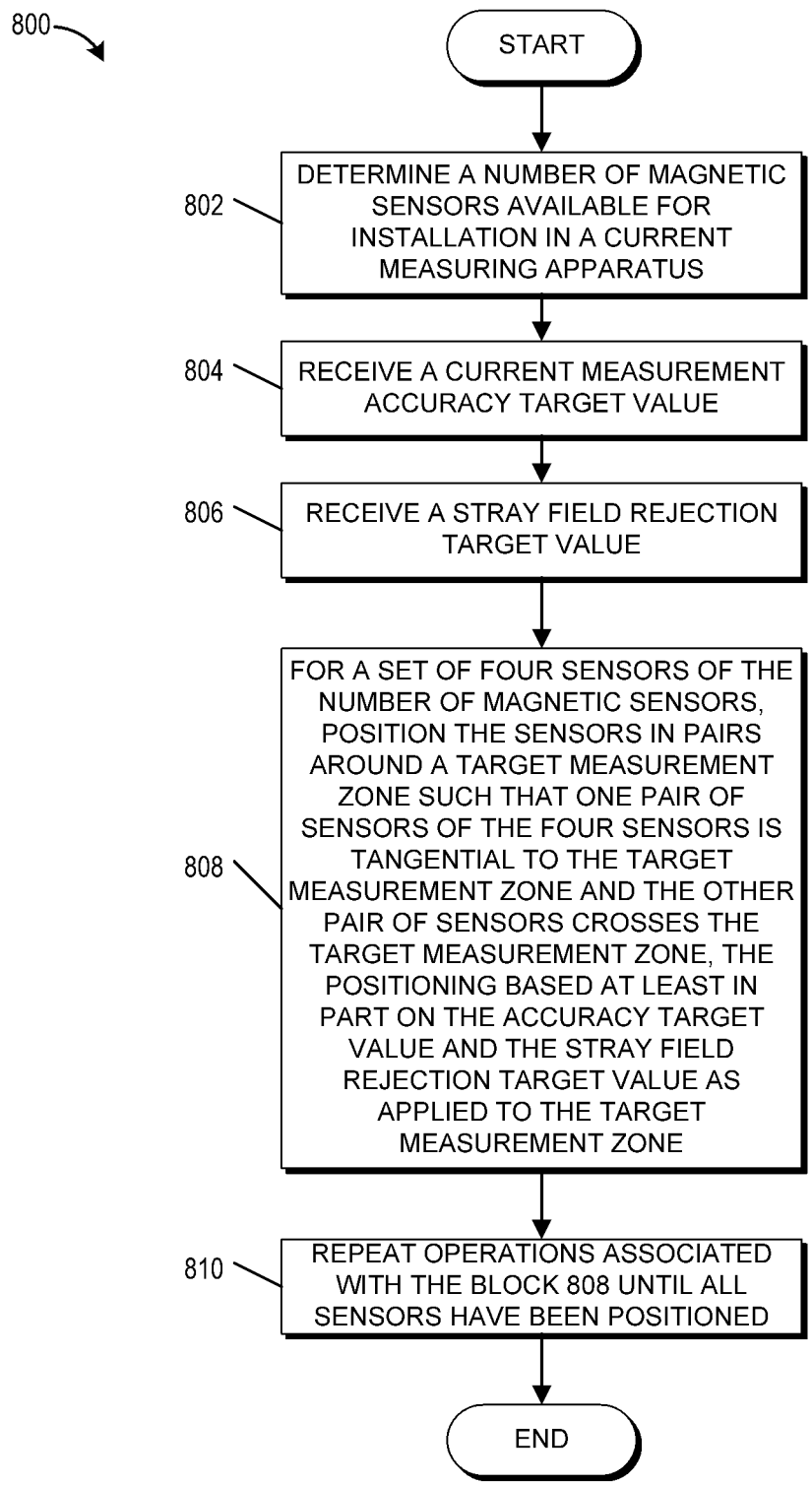
FIG. 8 presents a flowchart of an example sensor placement determination process in accordance with certain embodiments.

FIG. 8 presents a flowchart of an example sensor placement determination process 800 in accordance with certain embodiments. Some or all of the process 800 can be implemented by any computing system that can calculate a position for a set of sensors for measuring a current in a wire while reducing the impact of stray fields on the current measurement process. The process 800, in whole or in part, can be implemented by, for example, a hardware processor in communication with a non-transitory memory and configured to execute one or more instructions for determining where to place one or more sensors of a current measurement apparatus during manufacture of the current measurement apparatus. The hardware processor and memory may be part of a design or manufacturing system for designing and/or manufacturing the current measuring apparatus 202.

The process 800 begins at block 802 when, for example, a hardware processor determines a number of magnetic sensors available for installation in a current measuring apparatus 202. Typically, the number of sensors will be at least four sensors. However, it is often desirable to have more than four sensors, such as eight, ten, or twelve sensors, to increase the size of the target measurement zone and/or to improve the stray field rejection.

The number of sensors will typically be an even number enabling the mapping of sensors in pairs. For example, as illustrated with respect to FIG. 5, there may be eight sensors. Further, as previously described, the sensors may be magnetic sensors capable of measuring an amount of current flowing in a wire. For example, the sensors may be anisotropic magnetoresistance (AMR) sensors or Hall effect sensors.

At block 804, the hardware processor receives a current measurement accuracy target value. The current measurement accuracy target value may include a value indicating a desired accuracy at a particular point within the target measurement area 304. Alternatively, or in addition, the current measurement accuracy target value may be associated with a region. For example, the current measurement accuracy target value may be 99% for the entire target measurement area 304. Alternatively, the current measurement accuracy target value may correspond to a particular distance. For example, the current measurement accuracy target value may indicate different accuracy values at different distances from a point or an area within the target measurement area 304.

At block 806, the hardware processor receives a stray field rejection target value. Similar to the current measurement accuracy target value, the stray field rejection target value may indicate amount or percentage of stray field rejection at a particular distance from the target measurement area 304. In some embodiments, the current measurement accuracy target value and the stray field rejection target value are inversely linked. In other words, in certain embodiments, the greater the desired accuracy of the current measurement the lower the possible stray field rejection.

At block 808, for a set of four sensors of the number of magnetic sensors, the sensors are positioned in pairs around a target measurement zone such that one pair of sensors of the four sensors is tangential to the target measurement zone and the other pair of sensors crosses through the target measurement zone. In some embodiments, the block 808 may include performing one or more simulations with the sensors positioned around a simulated target measurement zone. The simulations may be used to confirm that the selected sensor positions satisfy the desired current measurement accuracy target value and/or the stray field rejection target value. If the desired target values are satisfied, the current measuring apparatus 202 can be created or manufactured using the determined sensor positions. If the desired target values are not satisfied, the sensor positions may be modified and the simulation process may be repeated. The position of the sensors may be determined based at least in part on the accuracy target value and the stray field rejection target value is applied to the target measurement zone. As previously described, at least some of the sensors may be positioned with different radii or at a different distance from a particular point within a target measurement zone than at least some of the other sensors. Further, the sensors are generally positioned to create a roughly circular target measurement zone. However, in some embodiments, the sensors may be positioned to create a target measurement zone of a different shape, such as a square, a rectangle, or an oval. The sensors may be positioned in a region surrounding the target current region, with pairs of sensor at multiple radii. In other words, in some cases, different pairs of sensors may be positioned at different radii. Further, in some cases, each sensor of a pair of sensors may be positioned at different radii. The mathematical formula used to evaluate performance is V=α I/d. This formula can also be written as I=β V*d, where α and β are scalars, V refers to voltage, and I refers to current. These formulas may be evaluated over many different sensor positions corresponding to regions of accuracy, regions where stray fields need to be rejected, and over various current ranges.

At block 810, the operations associated with the block 808 are repeated until all positions of sensors identified at the block 802 have been determined. In some embodiments, at least some of the sensors may be paired with different sensors when determining the position of sensors yet to be positioned. For example, suppose that the FIGS. 6A through 6C represent three performances of the block 808. As part of the second performance of the block 808, corresponding to FIG. 6B, the sensors V1, V2, V3, and V4 are positioned based at least in part on one or more of a desired size of a target measurement zone, a desired current measurement accuracy within the target measurement zone, and a desired stray field rejection within the current measurement zone. As part of the third performance of the block 808, corresponding to FIG. 6C, the sensors V5 and V7 may be positioned using the already positioned sensors V3 and V4 as a guide for determining the position of the sensors V5 and V7. Alternatively, in certain embodiments, the position of each of the sensors may be determined as part of a single process, such as a single performance of the block 808.

Example Current Measurement Process

Figure 9:
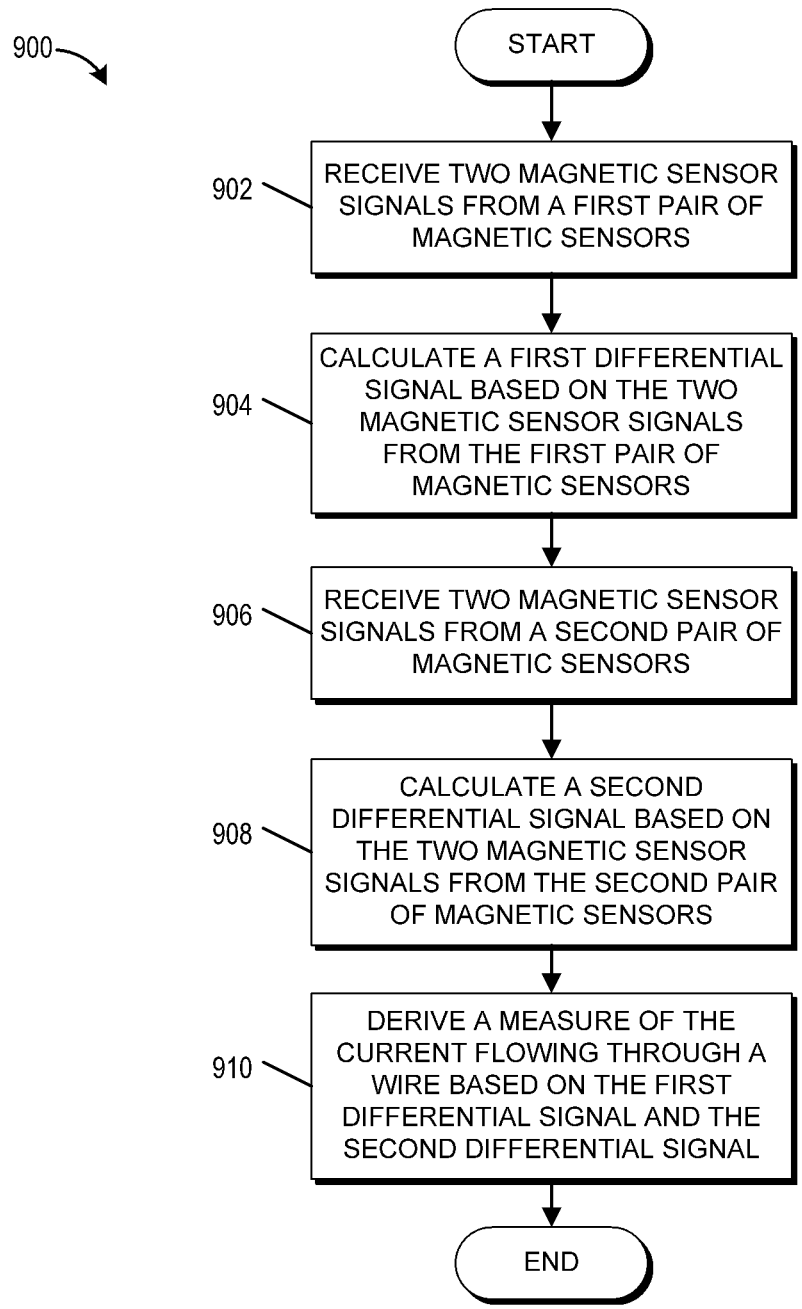
FIG. 9 presents a flowchart of an example current measurement process in accordance with certain embodiments.

FIG. 9 presents a flowchart of an example current measurement process 900 in accordance with certain embodiments. The process 900 can be implemented by any current measurement system that can measure the amount of current flowing through a wire. The process 900, in whole or in part, can be implemented by, for example, the mobile current measuring apparatus 202, the current measuring unit 204, one or more processors 208, the sensors 206, and the like. The process 900 may be performed in response to a wire being positioned within an opening of the current measuring apparatus 202, positioned within a target measurement zone of the current measuring apparatus 202, a command from a user, or any other trigger that may initiate measurement of a current in a wire. In some embodiments, the current measuring apparatus 202 is permanent or affixed to a component enabling continuous or intermittent monitoring of current in a wire or a device. In some such embodiments, the process 900 may be performed intermittently or continuously.

The process 900 begins at block 902 when, for example, the processor 208 receives two magnetic sensor signals from a first pair of magnetic sensors 206. The two magnetic sensors signals may measure a magnetic field created by a wire positioned within a target measurement zone of the current measuring apparatus 202. The wire may be any type of current carrying wire. For example, the wire may be a motor control wire, a wire on or connected to a printed circuit board (PCB), or any other type of current carrying wire. The magnetic field may be formed as a result of current flowing in the wire in accordance with Oersted's law. Each sensor may generate a different signal corresponding to a different measurement of the magnetic field based at least in part on the distance of the wire from the sensor. Further, stray field interference may, in some cases, result in different measurements being obtained by the two sensors.

At block 904, the processor 208 calculates a first differential signal based on the two magnetic sensor signals from the first pair of magnetic sensors. The differential signal may be created by taking a difference of the signals from the two magnetic sensors. In some embodiments, a scaler value may be applied to the differential signal, or to each of the magnetic sensor signals. In some embodiments, instead of or in addition to the differential signal, the processor 208 may create an aggregate signal. This aggregate signal may be an average of the signals output by the pair of magnetic sensors. In certain embodiments, as the wire moves closer to one sensor, the signal output by the sensor may increase or be stronger. Conversely, the signal output by the other sensor of the pair of magnetic sensors may decrease or be weaker as the wire moves away from the sensor. In some cases, movement of the wire may cause the wire to move nearer or farther from both sensors causing the output to increase or decrease from both sensors.

At block 906, the processor 208 receives two magnetic sensor signals from a second pair of magnetic sensors. The two magnetic sensors signals may measure the magnetic field created by the wire positioned within the target measurement zone of the current measuring apparatus 202. As with the first pair of sensors at the block 902, each of the sensors at the block 906 may generate a different signal corresponding to a different measurement of the magnetic field based at least in part on the distance of the wire from the sensor. Further, stray field interference may, in some cases, result in different measurements being obtained by the two sensors.

At block 908, the processor 208 calculates a second differential signal based on the two magnetic sensor signals from the second pair of magnetic sensors. As described with respect to the block 904, the differential signal may be created by taking a difference of the signals from the two magnetic sensors. Further, as with the block 904, a scaler value may, in some embodiments, be applied to the differential signal, or to each of the magnetic sensor signals. Moreover, as with the block 904, the block 908 may alternatively or additionally calculate an aggregate value for the output of the pair of magnetic sensors. The values generated by the second pair of magnetic sensors may be used to facilitate measurement of the current in the wire in a second direction differing from the direction of the line connecting the first pair of sensors. Each additional pair of sensors may help improve the measurement of the current in the wire being measured while reducing the impact of stray field interference from signals near the target measurement zone.

At block 910, the processor 208 derives a measure of the current flowing through a wire based on the first differential signal and the second differential signal. For an individual sensor, the sensor output is proportional to the measured current and inversely proportional to the distance between the target current and the sensor. V=α I/d. This formula can also be written as I=β V*d. The constant β can compensate for a single distance. As the distance changes (such as when the wire moves around in the region of accuracy) an error in the current measurement estimate may be introduced. By utilizing two (or more) sensors, each sensor can be positioned so that as the distance between the current and the first sensor increases, the distance between the second sensor decreases. This method helps mitigate position/distance uncertainty in one dimension, but may not completely eliminate the error. Generally, the sensor distance compensation method works best if the sensors are placed far apart, centered around the region of interest; however, the farther apart the sensors are, the more prone the measurement is to stray fields. Increasing the number of sensor pairs allows distance/position compensation in additional dimensions.

With each added sensor pair, the tradeoff between stray field rejection and accuracy in the target region should be considered.

Advantageously, some of the embodiments disclosed herein have been demonstrated to provide improved accuracy and reduced interference compared to existing systems. For example, with reference to the sensor configuration of FIG. 5, the outputs of eights sensors may be combined into six sensor pairs. These outputs may be scaled with a linear scaling factor and combined. The 6 sensors pairs are V3−V4, −V1−V2, V3+V4, V7−V5, V7−V8, −V5−V6. Each of these pairs may be provided a scaling factor of −0.007, 0.028, 0.028, −0.004, −0.0158, and −0.0158 respectively. When the resulting scaled formula is evaluated over a 2 dimensional space, the resulting stray field rejection (FIG. 7A) and accuracy (FIG. 7B) plots show the sensor output may be combined in an manner to provide an accurate current reading in the target region while providing minimal reaction to current placed in positions corresponding to stray currents. For example, a stray current placed 40 mm from the center is reduced by over −40 dB. This is a significant improvement over some existing systems, which may be represented by the rejection pattern shown in FIG. 1B, and which shows worse than −26 dB rejection of stray fields, even as the interference is placed over 100 mm from center.

As previously described, the current measuring apparatus 202 may include more than two pairs of sensors. For example, the current measuring apparatus 202 may include eight sensors. In such embodiments, operations associated with the blocks 902 and 904 (or 906 and 908) may be repeated for each pair of sensors. The resulting differential signals may be combined at the block 910 to obtain a measurement of the current flowing through the wire being measured.

TERMINOLOGY AND CONCLUSION

Principles and advantages discussed herein can be used in any device to measure the current flowing through a wire. Further, embodiments disclosed herein can be used to increase a zone or area in which a wire can be located during measurement of the current flowing through the wire thereby making it possible to measure the current in wires that are awkwardly positioned or are blocked by other components. Further, embodiments disclosed herein improve the accuracy of the current measurement and/or reduce the impact of stray field interference on the current measurement in the wire.

It is to be understood that not necessarily all objects or advantages may be achieved in accordance with any particular embodiment described herein. Thus, for example, those skilled in the art will recognize that certain embodiments may be configured to operate in a manner that achieves or optimizes one advantage or group of advantages as taught herein without necessarily achieving other objects or advantages as may be taught or suggested herein.

Some or all of any the processes described herein may be embodied in, and fully automated via, software code modules executed by a computing system that includes one or more computers or processors. The code modules may be stored in any type of non-transitory computer-readable medium or other computer storage device. Some or all the methods may be embodied in specialized computer hardware.

Many other variations than those described herein will be apparent from this disclosure. For example, depending on the embodiment, certain acts, events, or functions of any of the algorithms described herein can be performed in a different sequence, can be added, merged, or left out altogether (e.g., not all described acts or events are necessary for the practice of the algorithms). Moreover, in certain embodiments, acts or events can be performed concurrently, e.g., through multi-threaded processing, interrupt processing, or multiple processors or processor cores or on other parallel architectures, rather than sequentially. In addition, different tasks or processes can be performed by different machines and/or computing systems that can function together.

The various illustrative logical blocks and modules described in connection with the embodiments disclosed herein can be implemented or performed by a machine, such as a processing unit or processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A processor can be a microprocessor, but in the alternative, the processor can be a controller, microcontroller, or state machine, combinations of the same, or the like. A processor can include electrical circuitry configured to process computer-executable instructions. In another embodiment, a processor includes an FPGA or other programmable device that performs logic operations without processing computer-executable instructions. A processor can also be implemented as a combination of computing devices, e.g., a combination of a DSP and a microprocessor, a plurality of microprocessors, one or more microprocessors in conjunction with a DSP core, or any other such configuration. Although described herein primarily with respect to digital technology, a processor may also include primarily analog components. For example, some or all of the signal processing algorithms described herein may be implemented in analog circuitry or mixed analog and digital circuitry. A computing environment can include any type of computer system, including, but not limited to, a computer system based on a microprocessor, a mainframe computer, a digital signal processor, a portable computing device, a device controller, or a computational engine within an appliance, to name a few.

Conditional language such as, among others, "can," "could," "might" or "may," unless specifically stated otherwise, are otherwise understood within the context as used in general to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Any process descriptions, elements or blocks in the flow diagrams described herein and/or depicted in the attached figures should be understood as potentially representing modules, segments, or portions of code which include one or more executable instructions for implementing specific logical functions or elements in the process. Alternate implementations are included within the scope of the embodiments described herein in which elements or functions may be deleted, executed out of order from that shown, or discussed, including substantially concurrently or in reverse order, depending on the functionality involved as would be understood by those skilled in the art.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B and C" can include a first processor configured to carry out recitation A working in conjunction with a second processor configured to carry out recitations B and C.

It should be emphasized that many variations and modifications may be made to the above-described embodiments, the elements of which are to be understood as being among other acceptable examples. All such modifications and variations are intended to be included herein within the scope of this disclosure and protected by the following claims.

What is claimed is:

1. An apparatus for measuring current flow through a wire, the apparatus comprising:
    a housing with an opening configured to receive a wire, wherein the opening corresponds to a target measurement zone for measuring a current flowing through the wire when the wire is positioned within the opening;
    a first pair of magnetic sensors within the housing and positioned such that a line between the magnetic sensors of the first pair:
        is substantially tangential to the target measurement zone, or
        is at a distance from the target measurement zone and parallel to the line that is substantially tangential to the target measurement zone;
    a second pair of magnetic sensors within the housing and positioned such that a line between the magnetic sensors of the second pair crosses through the target measurement zone; and
    a hardware processor in communication with the first pair of magnetic sensors and the second pair of magnetic sensors, the hardware processor configured to:
        calculate a first differential signal based at least in part on outputs from the first pair of magnetic sensors,
        calculate a second differential signal based at least in part on outputs from the second pair of magnetic sensors, and
        derive a measure of the current flowing through the wire based on the first differential signal and the second differential signal.

2. The apparatus of claim 1, wherein the opening is orthogonal to a length of the wire when the wire is positioned within the opening.

3. The apparatus of claim 1, wherein the target measurement zone is substantially circular.

4. The apparatus of claim 1, wherein the first pair of magnetic sensors and the second pair of magnetic sensors are positioned to measure the current flowing through the wire with a threshold degree of accuracy when the wire is positioned within the target measurement zone.

5. The apparatus of claim 3, wherein the threshold degree of accuracy comprises at least 99% accuracy over a 1 centimeter radius centered within the target measurement zone.

6. The apparatus of claim 1, wherein the first pair of magnetic sensors comprise anisotropic magnetoresistance (AMR) sensors.

7. The apparatus of claim 1, further comprising one or more additional pairs of magnetic sensors within the housing.

8. The apparatus of claim 7, wherein a third pair of magnetic sensors is positioned such that a line between the third pair of magnetic sensors is substantially tangential to the target measurement zone, and a fourth pair of magnetic sensors is positioned such that a line between the fourth pair of magnetic sensors crosses through the target measurement zone.

9. The apparatus of claim 8, wherein at least one magnetic sensor from the third pair of magnetic sensors or the fourth pair of magnetic sensors is a magnetic sensor included in one of the first pair of magnetic sensors or the second pair of magnetic sensors.

10. The apparatus of claim 1, wherein at least one sensor from the first pair of magnetic sensors is positioned a different distance from a center point of the target measurement zone than the other sensor from the first pair of magnetic sensors.

11. The apparatus of claim 1, wherein at least some of the sensors from the first pair of magnetic sensors and the second pair of magnetic sensors are positioned along a circle with a center at a center point of the target measurement zone.

12. The apparatus of claim 1, wherein the second pair of magnetic sensors is positioned such that the line between the second pair of magnetic sensors bisects the target measurement zone.

13. The apparatus of claim 1, wherein:
    the first differential signal is based on a difference of the outputs from the first pair of magnetic sensors, and further based on a scaler value applied to the difference, or
    the first differential signal is based on a difference of the outputs from the first pair of magnetic sensors, and further based on a scaler value applied to each of the outputs from the first pair of magnetic sensors prior to computing the difference of the outputs from the first pair of magnetic sensors.

14. The apparatus of claim 13, wherein:
    the second differential signal is based on a difference of the outputs from the second pair of magnetic sensors, and further based on a second scaler value applied to the difference, or
    the second differential signal is based on a difference of the outputs from the second pair of magnetic sensors, and further based on a second scaler value applied to each of the outputs from the second pair of magnetic sensors prior to computing the difference of the outputs from the second pair of magnetic sensors.

15. A method of measuring current through a wire, the method comprising:
    calculating a first signal based at least in part on output signals from a first pair of magnetic sensors, where the first pair of magnetic sensors comprises a first magnetic sensor and a second magnetic sensor positioned such that a line between the first magnetic sensor and the second magnetic sensor:
        is substantially tangential to the target measurement zone, or
        is at a distance from the target measurement zone and parallel to the line that is substantially tangential to the target measurement zone;

calculating a second signal based at least in part on output signals from a second pair of magnetic sensors, where the second pair of magnetic sensors comprises a third magnetic sensor and the fourth magnetic sensor positioned such that a line between the third magnetic sensor and the fourth magnetic sensor crosses through the target measurement zone; and deriving a measure of current flowing through a wire positioned within a target measurement zone based at least in part on the first signal and the second.

16. The method of claim 15, wherein the first signal is based on one or more of:
a differential signal based at least in part on the output signals from the first pair of magnetic sensors, and
an aggregate signal based at least in part on the output signals from the first pair of magnetic sensors.

17. The method of claim 16, wherein the second signal is based on one or more of:
a differential signal based at least in part on the output signals from the second pair of magnetic sensors, and
an aggregate signal based at least in part on the output signals from the second pair of magnetic sensors.

18. An apparatus for measuring current flow through a wire, the apparatus comprising:
a housing with an opening configured to receive a wire, wherein the opening corresponds to a target measurement zone for measuring a current flowing through the wire when the wire is positioned within the opening;
a first pair of magnetic sensors within the housing and positioned such that a line between the magnetic sensors of the first pair:
is substantially tangential to the target measurement zone, or
is at a distance from the target measurement zone and parallel to the line that is substantially tangential to the target measurement zone;
a second pair of magnetic sensors within the housing and positioned such that a line between the magnetic sensors of the second pair crosses through the target measurement zone; and
a hardware processor in communication with the first pair of magnetic sensors and the second pair of magnetic sensors, the hardware processor configured to:
calculate a first aggregate signal based at least in part on outputs from the first pair of magnetic sensors,
calculate a second aggregate signal based at least in part on outputs from the second pair of magnetic sensors, and
derive a measure of the current flowing through the wire based on the first aggregate signal and the second aggregate signal.

19. The apparatus of claim 18, wherein:
the first aggregate signal is based on an average of the outputs from the first pair of magnetic sensors, or
the second aggregate signal is based on an average of the outputs from the second pair of magnetic sensors.

20. The apparatus of claim 18, wherein the first pair of magnetic sensors comprise anisotropic magnetoresistance (AMR) sensors.

* * * * *